(12) United States Patent
Koh

(10) Patent No.: US 6,437,308 B1
(45) Date of Patent: Aug. 20, 2002

(54) LIGHT DETECTION CIRCUIT OF AN ELECTRONIC DEVICE

(75) Inventor: Young-Sik Koh, Suwon (KR)

(73) Assignee: Samsung Electronics Co., Ltd., Kyungki-Do (KR)

(*) Notice: Subject to any disclaimer, the term of this patent is extended or adjusted under 35 U.S.C. 154(b) by 0 days.

(21) Appl. No.: 09/525,598

(22) Filed: Mar. 14, 2000

(30) Foreign Application Priority Data

Mar. 15, 1999 (KR) .............................................. 99-08669

(51) Int. Cl.$^7$ ................................................. H01J 40/14
(52) U.S. Cl. .............................. 250/214 R; 250/214 A; 330/59
(58) Field of Search ......................... 250/214 R, 214 A, 250/214 LA, 214 C, 214 LS; 327/514; 330/59, 110, 308

(56) References Cited

U.S. PATENT DOCUMENTS 5,194,727 A * 3/1993 Johnson et al. ......... 250/214 R
6,232,591 B1 * 5/2001 Whelan et al. ......... 250/214 R

* cited by examiner

*Primary Examiner*—Kevin Pyo
(74) *Attorney, Agent, or Firm*—F. Chau & Associates, LLP

(57) ABSTRACT

A light detection circuit employed in an electronic device such as an integrated circuit card is disclosed. The light detection circuit having a constant voltage supply connected to a power supply voltage, a sensing circuit including an element responsive to light and connected to the power supply voltage, a first comparator for determining a current sensing state according to an exposure to light, a latch circuit for storing the output of the first circuit, and a second comparator for generating an output signal which controls the constant voltage supply, the sensing circuit, and the latch circuit. The latch circuit outputs a light detection signal in response to the output of the second comparator.

9 Claims, 4 Drawing Sheets

LIGHT DETECTION CIRCUIT OF AN ELECTRONIC DEVICE

BACKGROUND OF INVENTION

1. Field of the Invention

The present invention relates generally to an electronic device, and more particularly to a light detection circuit employed in an electronic device, such as a portable transaction card, having secured information needing protection from unauthorized access.

2. Description of Related Art

Portable transaction cards are now in widespread use. These cards include, for example, cash and credit cards, stock certificates, passage, identification, and health insurance cards. Most portable transaction cards store information about respective bearers, such as card number, bearer's name, expiration date, etc. The cards typically include a magnetic strip from which the information can be read. The information stored on these cards is of importance to their owners because loss of the information may result in unauthorized usage by others at the expense of the owners. Therefore, the information must be secured.

Recently, storage demands on portable transaction cards have increased. The traditional magnetic cards cannot satisfy the increasing storage demands. One solution is use of an advanced transaction card that stores more information than a magnetic card, i.e., IC (integrated circuit) cards or smart cards. The IC card is advantageous in physical integrity, as well as an enlarged storage capacity. Since the IC card stores more personal information, enhanced security features are needed for preventing unauthorized persons from accessing, stealing, or modifying information stored therein.

One method of securing information is by employing a light detection circuit on the IC card, from which a light detection signal is generated when an integrated circuit in the card is exposed to light. Once a light detection signal is generated, operations for processing and storing information from the card are inhibited. An example of such a circuit is found in U.S. Pat. No. 4,952,796, as shown in FIG. 1. The circuit of FIG. 1 has a diode 1 which is reverse-biased to a PMOS transistor 2 acting as a current load. Gate 3 of the PMOS transistor 2 is connected between a power supply voltage Vcc, a NMOS transistor 4, and coupled to a bias circuit 17. The bias circuit 17, having PMOS and NMOS transistors, 11 and 13, supplies a predetermined bias voltage to the PMOS transistor 2, turning the PMOS transistor 2 on. Thus, the PMOS transistor 2 retains an ON state while NMOS transistor 4 is in an OFF state.

When the diode 1 is not exposed to light, a negligible amount of a reverse saturation current (Is) flows through the diode 1. Therefore, the voltage level at node 29 is increased toward the power supply voltage. The output terminal 28 of an inverter including PMOS and NMOS transistors, 26 and 27, goes to low level, and output signal S from an inverter including PMOS and NMOS transistors, 30 and 31, goes to high level. Output signal SB from an inverter of PMOS and NMOS transistors, 32 and 33, is at low level.

When the diode 1 is exposed to light, a large amount of the reverse saturation current flows through the diode. If the reverse saturation current flows over a predetermined critical value (Im), the voltage level at the node 29 falls. Transistor 26 is turned on and transistor 27 is turned off, causing a voltage level at node 28 to be high and the output signal S to be low.

However, in the circuit shown in FIG. 1, generally the amount of the reverse saturation current varies due to manufacturing parameters and environmental temperature, which causes the critical value of the current, Im, to be uncertain. Further, the critical current value may be changed due to a current level of the power supply voltage.

SUMMARY OF THE INVENTION

The present invention solves the problem of variations in current Im described above. It is an object of the invention to provide a light detection circuit with a stable current during variations in environmental conditions.

It is another object of the invention to provide a light detection circuit, used in a personal transaction card such an integrated circuit card, which has a stabilized operation when environmental influences such as manufacturing parameters, temperature, and power supply voltage variations are present.

To accomplish those objects, according to a preferred embodiment of the invention, one feature of the present light detection circuit includes a first comparator for receiving a first signal having a first voltage and a second signal having a second voltage, the first voltage is discharged from a first predetermined voltage and the second voltage is discharged from a second predetermined voltage upon application of a power supply voltage, the second signal being responsive to light. The light detection circuit further includes a second comparator for receiving the second voltage and a reference voltage, and a circuit for charging the first and second voltages up to the first and second predetermined voltages in response to an active output signal from the second comparator.

An output signal of the first comparator is stored in a latch circuit and output from the latch circuit as a light detection signal in response to an output signal of the second comparator.

Alternatively, an electronic device having a light detection circuit for detecting the presence of light according to the present invention includes a constant voltage supply connected to a power supply node, a sensing circuit including an element responsive to light and connected to the power supply node, a reference voltage circuit connected to the power supply node, a first circuit for comparing an output of the sensing circuit with an output of the constant voltage supply and generating an output which determines a current sensing state, and a second circuit for comparing the sensing circuit output with a reference voltage and generating an output which controls the constant voltage supply, the sensing circuit, and the output of the first circuit. The light detection circuit further includes, a latch circuit for storing the output of the first circuit and generating a light detection signal in response to the output of the second circuit.

Another light detection circuit according to the present invention includes a constant voltage supply connected to a power supply node, a sensing circuit including an element responsive to light and connected to the power supply node, a first circuit for comparing an output of the sensing circuit with an output of the constant voltage supply and generating an output which determines a current sensing state, a latch circuit for storing the output of the first circuit, and a second circuit for comparing the sensing circuit output with a reference voltage and generating an output which controls the constant voltage supply, the sensing circuit, and the latch circuit. The latch circuit outputs a light detection signal in response to the output of the second circuit. The light detection circuit can be employed in an electronic device such as and integrated circuit card.

The constant voltage supply includes a PMOS transistor disposed between the power supply node and a constant voltage supply node, a capacitor disposed between the voltage supply node and a substrate voltage, and a diode disposed between the substrate voltage and the voltage supply node.

These and other objects, features, and advantages of the present invention will become apparent from the following detailed description of illustrative embodiments thereof, which is to be used in connection with the accompanying drawings.

BRIEF DESCRIPTION OF THE DRAWINGS

The preferred embodiments are described with reference to the drawings wherein.

In the figures, like reference numerals denote like or corresponding parts.

DETAILED DESCRIPTION OF PREFERRED EMBODIMENTS

A preferred embodiment of the present invention will be described below in more detail with reference to the accompanying drawings.

Figure 1:
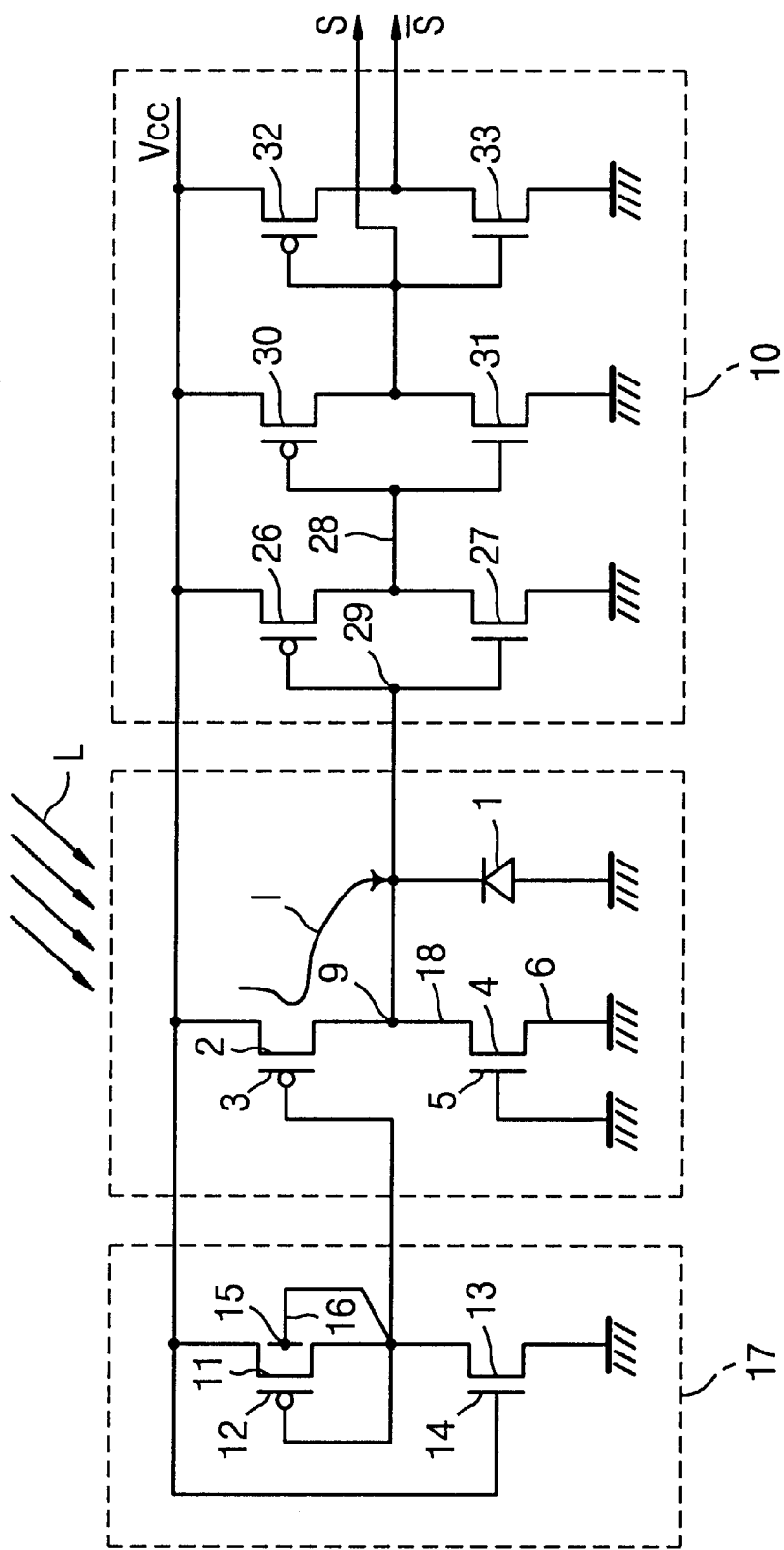
FIG. 1 shows a prior art light detection circuit.
Figure 2:
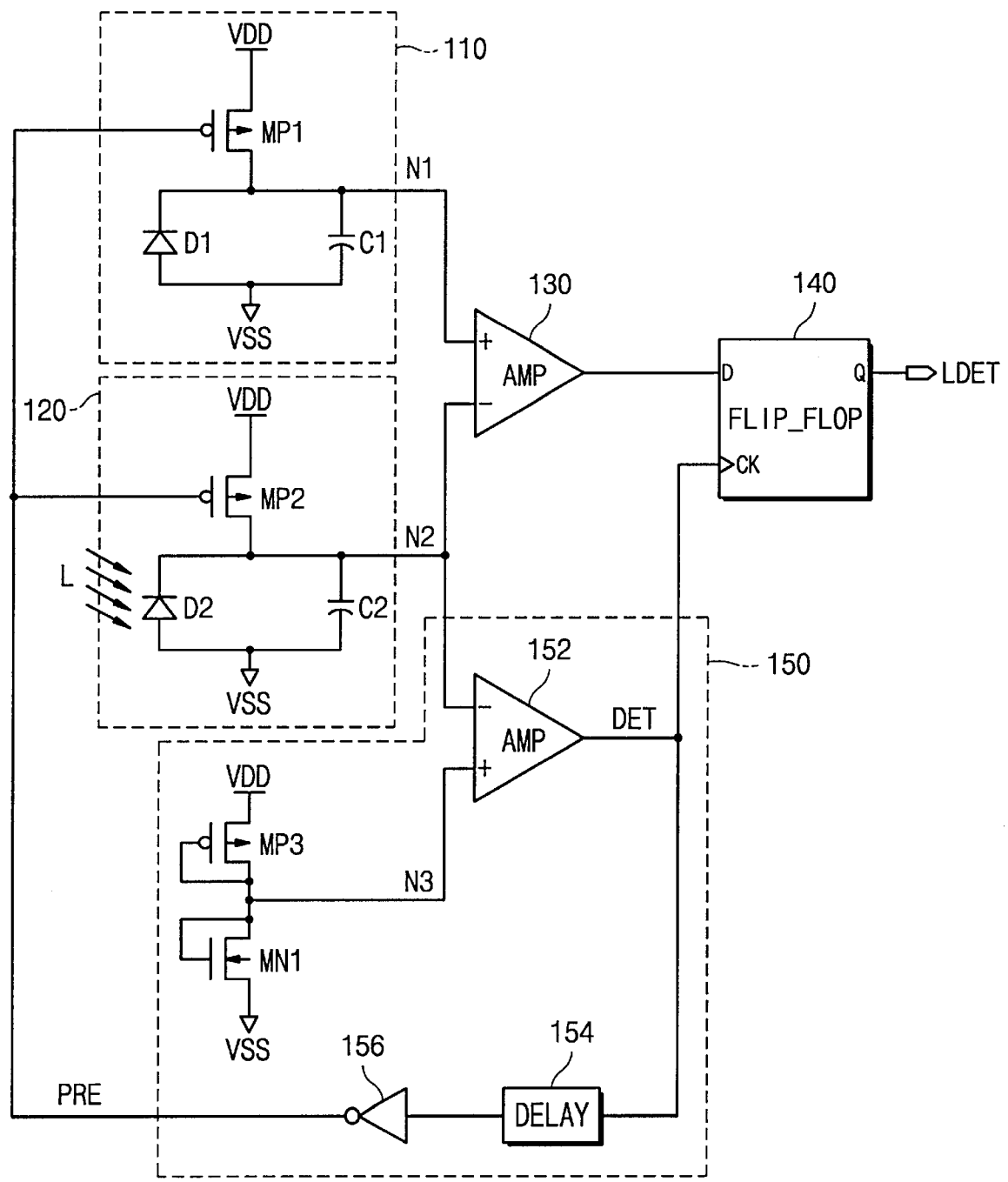
FIG. 2 shows a light detection circuit according to a preferred embodiment of the invention.

Referring to FIG. 2, a light detection circuit according to a preferred embodiment of the invention includes a constant voltage supply 110, a light sensing circuit 120, a comparator 130, a D-type flip-flop 140, and a pre-charge control circuit 150. The constant voltage supply 110 includes a PMOS transistor MP1 connected between power supply voltage VDD and a constant voltage supply node N1, a capacitor C1 connected between the node N1 and a substrate voltage VSS, and a diode D1 connected between the substrate voltage VSS and the node N1. The gate of the PMOS transistor MP1 is coupled to pre-charge signal PRE generated from the pre-charge control circuit 150.

The light sensing circuit 120 includes a PMOS transistor MP2 connected between a power supply voltage VDD and a sensing voltage node N2, a capacitor C2 connected between a node N2 and the substrate voltage VSS, a photo diode D2 is connected between the substrate voltage VSS and the node N2. The photo diode D2 generates current when it is exposed to light. The gate of the PMOS transistor MP2 is coupled to pre-charge signal PRE.

The capacitance of the capacitors C1 and C2 are identical. However, the diode D1 has a larger circuit area than that of the photo diode D2 by M times (M is a positive number, larger than 1, predetermined in a manufacturing design). A light sheltering material is deposited on the top of the diode D1 to shield the diode D1 from being exposed to light while the diode D2 is sensible to light when the light detection circuit is exposed to light.

Figure 3:
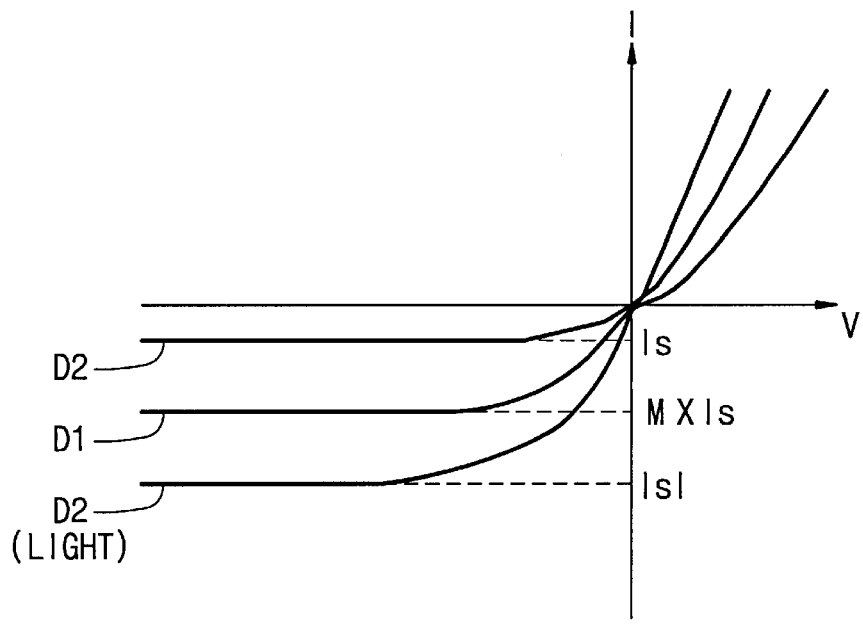
FIG. 3 is a graphic diagram showing I–V characteristics of diodes employed in the circuit of FIG. 2.

Referring to FIG. 3 showing I–V characteristics of the diodes D1 and D2, the amount of the reverse saturation current flowing through the diode D1 becomes M×Is (Is; the reverse saturation current of the diode D2 in the state of non-exposure to light) when the detection circuit is not exposed to light. On the other hand, when the detection circuit embedded in a personal transaction card, such as an IC card, is exposed to light by unsealing the IC card, a reverse saturation current flows through the diode D2, and Isl is larger than that through the diode D1.

Returning to FIG. 2, a non-inverted input terminal of the comparator 130 is coupled to the node N1 and an inverted input terminal of the comparator 130 is coupled to the node N2. The voltage level at node N2 is compared with the constant voltage level at node N1 in the comparator 130, which generates an output signal informing of a difference between the sensing voltage and constant voltage. The output signal is supplied to the D-type flip-flop 140. The D-type flip-flop 140 generates light detection signal LDET in response to the output signal from the comparator 130.

The pre-charge control circuit 150 includes a PMOS transistor MP3, a NMOS transistor MN1, a comparator 152, a delay circuit 154, and an inverter 156. The PMOS transistor MP3, whose gate is coupled to a reference voltage node N3, is connected between VDD and the node N3. The NMOS transistor MN1, whose gate is coupled to the node N3, is connected between the node N3 and VSS. The PMOS and NMOS transistors, MP3 and MN1, form a voltage divider causing the reference voltage of VDD/2 to be applied to the comparator 152 through the node N3. An inverted input terminal of the comparator 152 is coupled to the sensing voltage node N2, and a non-inverted input terminal of the comparator 152 is coupled to the reference voltage node N3. The comparator 152 generates detection signal DET informing of a difference between the sensing and reference voltages. The delay circuit 154 includes an even-number of inverters and generates a signal delayed from the detection signal DET and generates pre-charge signal PRE to be applied to the gates of the PMOS transistors, MP1 and MP2.

Figure 4A:
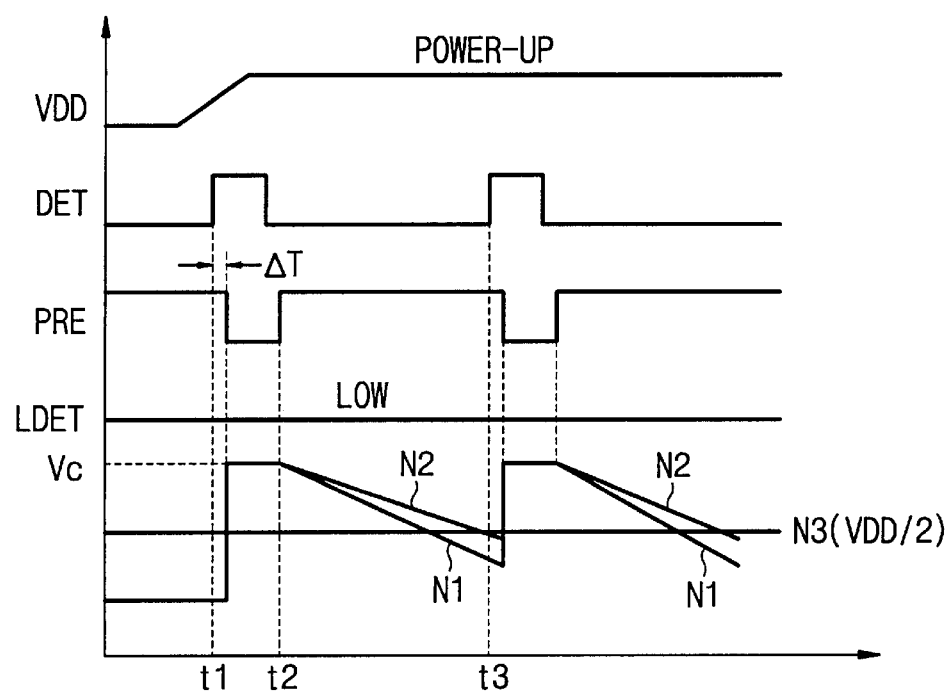
FIGS. 4A and 4B are timing diagrams of signals and voltages conductive in the circuit of FIG. 2, when the circuit of FIG. 2 is in the condition of non-exposure and exposure to light, respectively.

Now, a detecting (or sensing) operation of the circuit shown in FIG. 2 will be explained with the reference to FIGS. 2 through 4B. Referring to FIG. 4A, when the power supply voltage VDD is set up in the condition of non-exposure to light, at time t1, the reference voltage node N3 is charged up to VDD/2 by the voltage dividing loop of the PMOS and NMOS transistors, MP3 and MN1. As the sensing voltage node N2 initiates at the voltage level of VSS, the detection signal DET generated from the comparator 152 goes to high level at the time t1. The detection signal DET is converted into the pre-charge signal PRE that is delayed from DET by ΔT and inverted to low level, after passing through the delay circuit 154 and the inverter 156.

The low-leveled pre-charge signal PRE causes the PMOS transistors MP1 and MP2 to be turned on, and the capacitors C1 and C2 are charged up to the voltage level of about VDD. Further, Vc, the voltage across C1 and C2, during PRE is maintained at low level. Thus, the constant and sensing voltages at nodes N1 and N2, respectively, are increased. If a current sensing voltage at the node N2 is increased over the reference voltage of VDD/2, the detection signal DET from the comparator 152 falls to low level and then the pre-charge signal PRE goes to high level, turning the PMOS transistors, MP1 and MP2, off.

As the PMOS transistors MP1 and MP2 are shut off, during the pre-charge signal PRE is held at high level, the capacitors C1 and C2 are discharged, from time t2, each through the diodes D1 and D2 from the charged voltage level Vc. At this time (the non-exposure state), the amount of the reverse saturation current flowing through D1 is larger than that through the diode D2, therefore, the voltage level at the node N1 is decreased more quickly then the voltage level at the node N2. Therefore, the output signal from comparator 130, i.e., the light detection signal LDET, becomes low level and is latched in the D-type flip-flop 140. If the decreasing voltage at the node N2 goes under the reference voltage VDD/2 at time t3, the detection signal DET from the comparator 152 returns to high level, causing the D-type flip-flop 140 to output the low-leveled light detection signal LDET held therein so as to inform the IC card (including the light detection circuit of FIG. 2) of the closed state (or concealed). The aforementioned operation is repeatedly carried out during the power-up state with VDD, as shown in FIG. 4A.

Figure 4B:
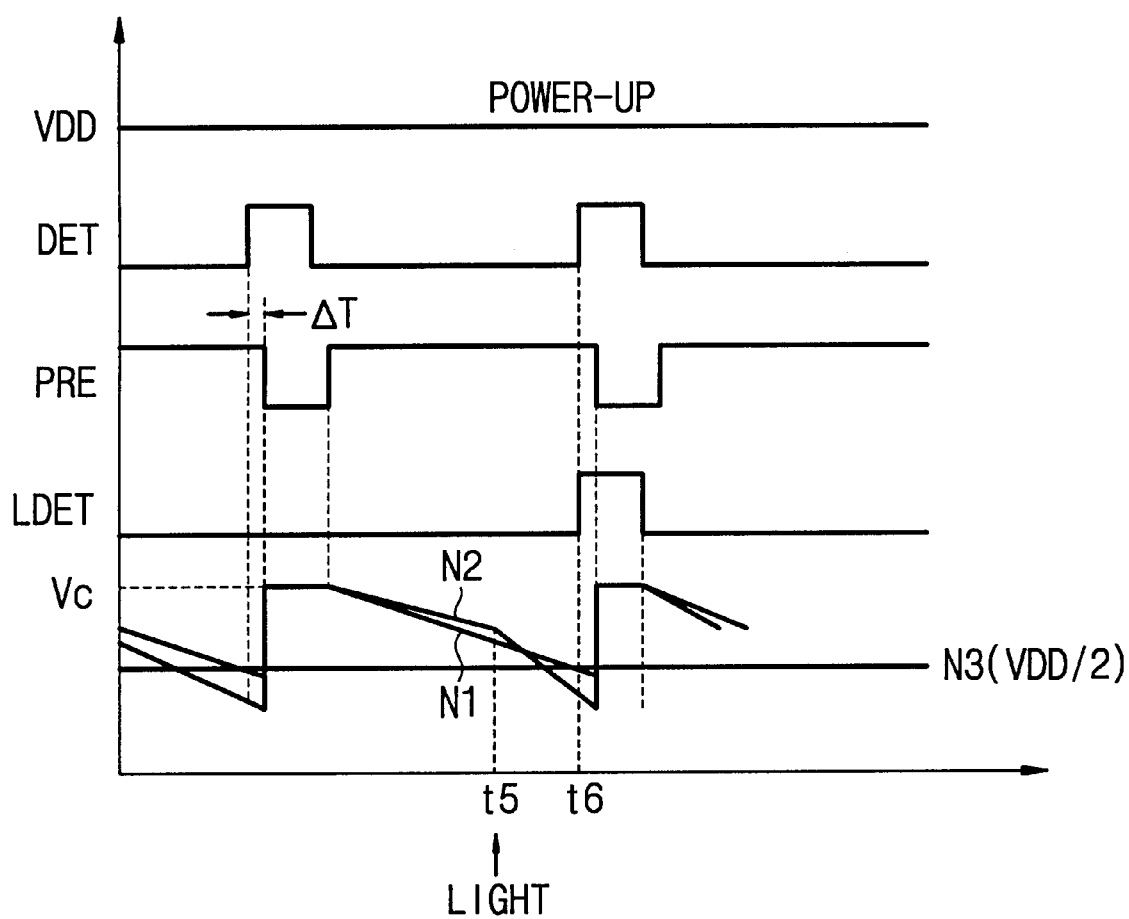

Alternatively, referring to FIG. 4B, showing the condition during exposure to light from time t5 during the power-up state, the photo diode D2 is put into a light-sensible state and the reverse saturation current flowing through D2, Isl, becomes greater than that through D1, M×Is, which is unable to be responsible to light by the sheltering film. Therefore, during the pre-charge signal PRE is disable with high level, as the sensing voltage at the node N2 falls more quickly than the voltage at the node N1 does from the time t5, the output signal from the comparator 130 becomes high level and stored in the D-type flip-flop 140. When the voltage at the node N2 falls under the reference voltage VDD/2, at time t6, the detection signal DET goes to high level and thereby the high-leveled light detection signal LDET preliminarily latched is output from the D-type flip-flop 140, informing the IC card of an open state (or unsealed).

The method for detecting an unauthorized opening causes a control circuit (not shown) in the IC card (or a smart card) to run a protecting process which disables the operations of a processing unit or data storage unit.

As described above, since the light detection circuit utilizes the reverse saturation current of the diodes in order to sense whether there is an unauthorized opening of an IC card, by comparing the current sensing voltage with the constant voltage corresponding to a variation of the power supply voltage, and using internal control signals, e.g., the pre-charge signal, resulting from the comparison of the current sensing voltage with the reference voltage corresponding to a variation of the power supply voltage, a more reliable detecting operation is possible to enhance accuracy and stability of the security function of an useful personal transaction card such as an IC card (or a smart card).

Although specific constructions and procedures of the invention have been illustrated and described herein, it is not intended that the invention be limited to the elements and constructions disclosed. One skilled in the art will easily recognize that the particular elements or sub-construction may be used without departing from the scope and spirit of the invention.

What is claimed is:

1. An electronic device having a light detection circuit comprising:
   a first comparator for receiving a first signal having a first voltage and a second signal having a second voltage, the first voltage which is discharged from a first predetermined voltage and the second voltage is discharged from a second predetermined voltage upon application of a power supply voltage, the second signal being responsive to light;
   a second comparator for receiving the second voltage and a reference voltage; and
   a circuit for charging the first and second voltages up to the first and second predetermined voltages in response to an active output signal from the second comparator.

2. The electronic device of claim 1, further comprising a latch circuit for storing an output signal of the first comparator, the latch circuit being responsive to an output signal of the second comparator.

3. An electronic device having a light detection circuit for detecting the presence of light comprising:
   a constant voltage supply connected to a power supply node;
   a sensing circuit including an element responsive to light and connected to the power supply node;
   a reference voltage circuit connected to the power supply node;
   a first circuit for comparing an output of the sensing circuit with an output of the constant voltage supply and generating an output which determines a current sensing state; and
   a second circuit for comparing the sensing circuit output with the reference voltage and generating an output that controls the constant voltage supply, the sensing circuit, and latches the output of the first circuit.

4. The electronic device of claim 3, further comprising a latch circuit for storing the output of the first circuit, the latch circuit being responsive to the output of the second circuit.

5. The light detection circuit of claim 3, wherein the constant voltage supply comprises:
   a PMOS transistor disposed between the power supply node and a constant current supply node;
   a capacitor disposed between the constant current supply node and a substrate voltage; and
   a diode disposed between the substrate voltage and the constant current supply node.

6. A light detection circuit comprising:
   a constant voltage supply connected to a power supply node;
   a sensing circuit including an element responsive to light and connected to the power supply node;
   a first circuit for comparing an output of the sensing circuit with an output of the constant voltage supply and generating an output which determines a current sensing state;
   a latch circuit for storing the output of the first circuit; and
   a second circuit for comparing the sensing circuit output with a reference voltage and generating an output that controls the constant voltage supply, and the sensing circuit;
   wherein the latch circuit outputs a light detection signal in response to the output of the second circuit.

7. The light detection circuit of claim 6, wherein the light detection circuit is employed in an electronic device for detecting the presence of light.

8. The light detection circuit of claim 7, wherein the electronic device is an integrated circuit card.

9. The light detection circuit of claim 6, wherein the constant voltage supply comprises:
   a PMOS transistor disposed between the power supply node and a constant current supply node;
   a capacitor disposed between the constant current supply node and a substrate voltage; and
   a diode disposed between the substrate voltage and the constant current supply node.

* * * * *